United States Patent [19]

Dalrymple

[11] 4,446,381

[45] May 1, 1984

[54] CIRCUIT AND TECHNIQUE FOR INITIALIZING THE STATE OF BISTABLE ELEMENTS IN AN INTEGRATED ELECTRONIC CIRCUIT

[75] Inventor: Monte J. Dalrymple, Fremont, Calif.

[73] Assignee: Zilog, Inc., Campbell, Calif.

[21] Appl. No.: 370,601

[22] Filed: Apr. 22, 1982

[51] Int. Cl.³ .................. H03K 17/22; H03K 17/30; H03K 17/687

[52] U.S. Cl. ......................... 307/200 B; 307/238.3; 340/362; 340/363; 365/228

[58] Field of Search ............ 307/200 A, 200 B, 238.3, 307/238.6; 340/362, 363; 365/228

[56] References Cited

U.S. PATENT DOCUMENTS

| | | | |
|---|---|---|---|
| 4,099,068 | 7/1978 | Kobayashi et al. | 307/200 A |
| 4,140,930 | 2/1979 | Tanaka | 307/200 B |
| 4,232,236 | 11/1980 | Yomogida et al. | 307/200 A |
| 4,366,560 | 12/1982 | McDermott et al. | 307/200 A |
| 4,386,281 | 5/1983 | Terry | 307/200 B |

*Primary Examiner*—John S. Heyman
*Attorney, Agent, or Firm*—Majestic, Gallagher, Parsons & Siebert

[57] ABSTRACT

A circuit and technique provided as part of an integrated circuit for assuring that the circuit's many bistable elements are properly initialized into their desired state when the power is turned on to the circuit. An initialization signal is developed for forcing the bistable element to their pre-determined states as the voltage of the power source is brought up from zero to its full value. This is accomplished by using another bistable element to monitor the rise in the supply voltage and turn off the initialization signal only after the supply voltage has risen well above the threshold voltage of the various bistable elements on the circuit. Hysteresis is provided in order to prevent the initialization signal from turning on if the supply voltage temporarily dips below that at which the monitor element turns off the initiation signal.

6 Claims, 8 Drawing Figures

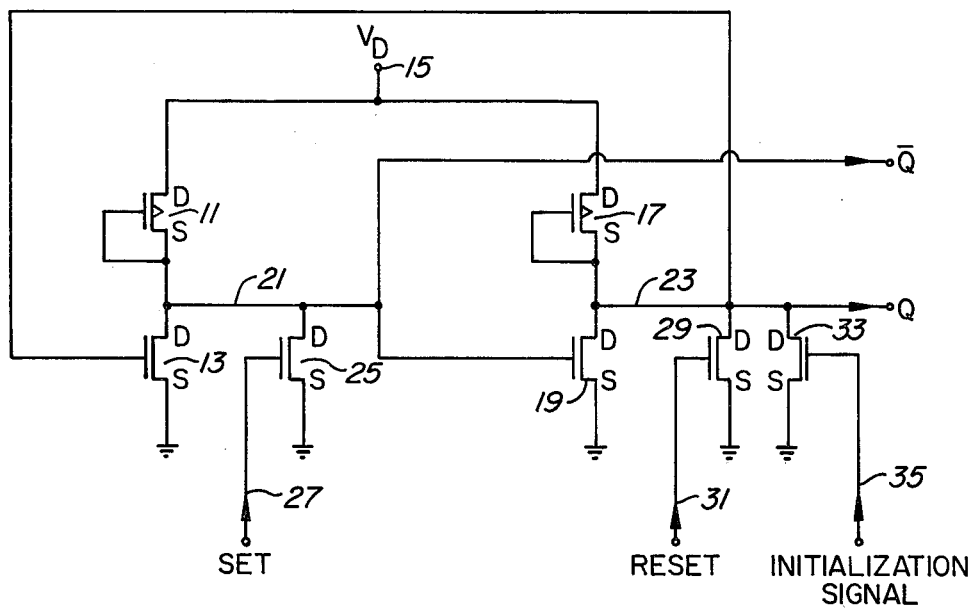
FIG._1.   PRIOR ART
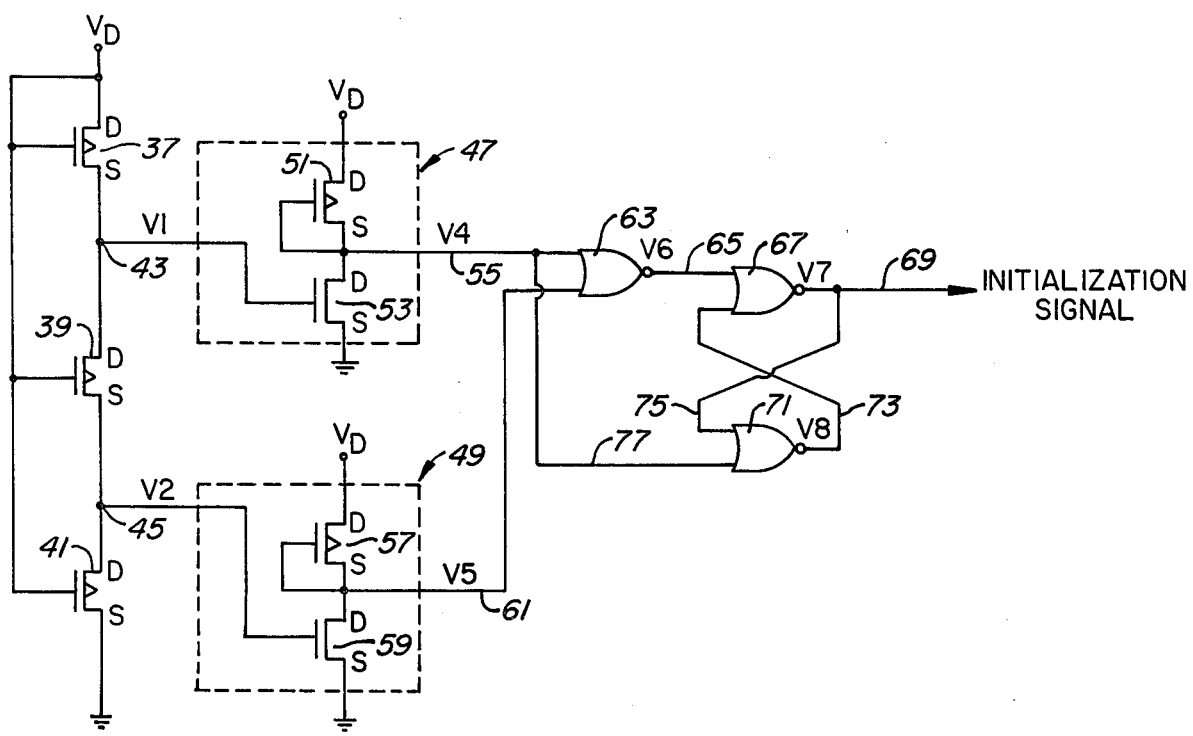
FIG._2.

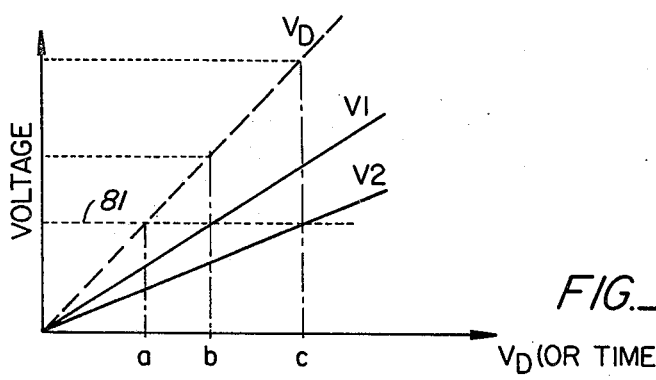
FIG._3A.
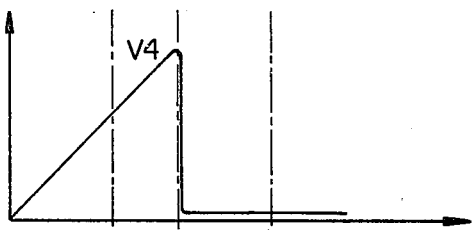
FIG._3B.
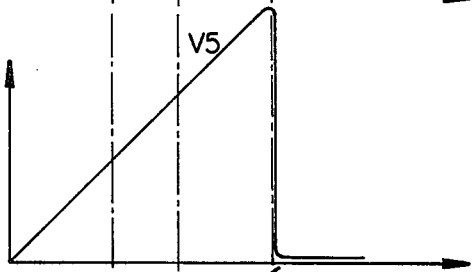
FIG._3C.
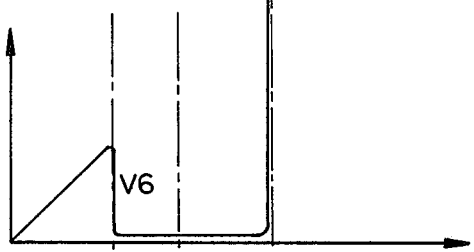
FIG._3D.
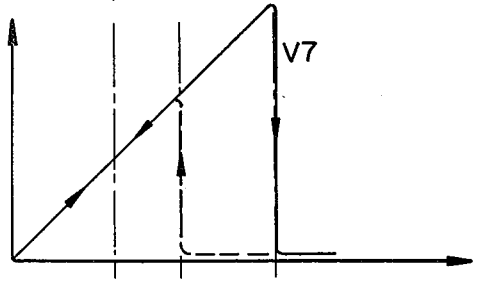
FIG._3E.
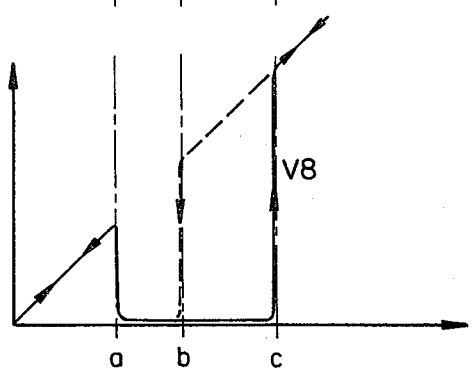
FIG._3F.

CIRCUIT AND TECHNIQUE FOR INITIALIZING THE STATE OF BISTABLE ELEMENTS IN AN INTEGRATED ELECTRONIC CIRCUIT

BACKGROUND OF THE INVENTION

This invention relates generally to the art of electronic integrated circuits and, more particularly, to circuits and techniques for initializing bistable circuit elements when power is turned on to these elements.

Digital integrated circuits all contain bistable semiconductor elements in the form of registers, latches, flip-flops, memory elements and the like. Each of these circuit elements generally has two portions, one of which is "on" while the other is "off". When power is turned on to such a circuit element, the voltage increases from zero to its maximum value over a finite, although short, time. When the voltage reaches the threshold level of one of the portions of such a circuit element, the element will initialize into one of its two states. Since it is difficult for all elements to be formed on an integrated circuit chip with exactly the same threshold voltage, it is impossible to control in the manufacturing process the initial stage that will be assumed by each bistable circuit element when power is turned on to it.

It is, therefore, common to include with each such bistable circuit element an additional transistor placed in one portion or the other of a bistable element, depending upon which initial state is desired for the element when the power is turned on. This transistor operates in response to an initialization signal. A special monitoring element is employed to maintain the initialization signal until the monitor changes its state when the power supply voltage rises above its threshold. But since the threshold voltages among the various semiconductor circuit elements can vary as a result of their processing, it has been found that many of these elements have not settled into their initial state before the initialization signal is terminated. The result is that certain circuits will randomly carry initial states that are different from those desired.

One technique that has been utilized to overcome this problem is to add a timing circuit as part of the initialization circuit, so that the initialization signal remains for a preset period after the supply voltage exceeds the monitoring element threshold. This gives some extra time for those bistable circuit elements that might have higher threshold voltages to settle into the desired initial state before the initialization signal is terminated. But such timing circuits are difficult to control in the manufacturing process.

Therefore, it is a principal object of the present invention to provide an improved initialization circuit and technique that allows all bistable elements in an integrated circuit to be initialized in their desired states, one that is reproducible from chip to chip, and one that operates equally well under varying power supply voltage.

SUMMARY OF THE INVENTION

This and additional objects are accomplished by the various aspects of the present invention wherein, briefly, a semiconductor monitoring circuit is utilized that is similar in the number of transistors and general construction as found in the bistable elements of the circuit to which an initialization signal generated by the monitor is applied. By using a full monitor circuit, this more nearly matches in threshold voltages the bistable element circuits. A voltage divider is provided across the voltage supply source and a tapped, lower voltage is utilized as a gate signal to switch the monitoring transistor circuit. The result is that the monitoring circuit switches at a time after the supply voltage reaches the monitoring circuit's threshold voltage since it is this reduced voltage that actually triggers the device. The device is not triggered until the reduced voltage reaches its threshold, this occurring at a time after the full supply voltage reaches that threshold level. In order to prevent the initialization signal from turning on as the supply voltage temporarily dips below that at which the monitor turns off the initialization signal, logic circuits provide a hysteresis.

Additional objects, advantages and features of the present invention will become apparent from the following description of its preferred embodiments, which description should be taken in conjunction with the accompanying drawings.

BRIEF DESCRIPTION OF THE DRAWINGS

FIG. 1 shows a typical bistable element that is provided in a digital integrated circuit for which its initial state is desired to be controlled when the power is first turned on to the device;

FIG. 2 shows one form of an initialization signal circuit utilizing the various aspects of the present invention; and FIGS. 3A through 3F show voltage waveforms at various points of FIG. 2.

DESCRIPTION OF A PREFERRED EMBODIMENT

Referring initially to FIG. 1, a typical bistable circuit that is found in digital integrated circuits will be described. FIG. 1 shows a typical latch made up of two inverters. All of the transistors shown are metal-oxide-silicon (MOS) devices, which may either be of the NMOS or CMOS type. Bipolar transistors may alternatively be employed but are usually not utilized.

A first inverter is formed of two series transistors 11 and 13 connected between a voltage supply terminal 15 ($V_D$) and ground potential. Connected between the same two points is a second inverter circuit formed of series transistors 17 and 19. The gates of each of the transistors 11 and 17 are connected to their source terminals. An output 21 of the first inverter is connected as an input to the second inverter, namely connected to the gate of transistor 19. An output conductor 23 of the second inverter is also connected to an input of the first inverter, namely to the gate of transistor 13. The output 21 of the first inverter is the standard $\overline{Q}$, while the output of the second inverter at conductor 23 is the standard Q output.

The first inverter includes another transistor 25 connected between ground potential and the output line 21. Its gate is connected to an input line 27, which, when energized, causes the transistor 25 to become conductive and set the latch circuit of FIG. 1. Similarly, the second inverter contains a third transistor 29 connected between ground potential and the output line 23. Its gate is connected through a conductor 31 to a reset input of the latch circuit of FIG. 1.

Yet another transistor 33 is shown in the circuit of FIG. 1 to be connected between the output 23 and ground potential, its gate being connected through a conductor 35 to an initialization signal input. If the latch circuit of 31 omits the transistor 33, the switching of the power on by connecting the source $V_D$ to the circuit makes it unpredictable as to whether the latch circuit will be in its set or reset state after the voltage rises from zero to the maximum supply voltage $V_D$. The particular state of such a latch circuit would depend, primarily, upon which of the transistors 13 or 19 is first rendered conductive since that would fix the state of the latch until a set or reset signal is received to change that state. The initial state to which the circuit would latch, therefore, depends upon which of the transistors 13 or 19 has the lower threshold voltage above which it becomes conductive. It is attempted in integrated circuits to make all transistors with the same threshold voltage but this is practically impossible because of variations in processing. Therefore, the transistor 33 is placed in one or the other of the inverters of the FIG. 1 latch, being shown connected in the second inverter in this particular example. The transistor 33 is designed to be rendered conductive by an initialization signal thereby to hold the line 23 near ground potential and give the latch circuit an initial reset state.

In existing circuits, the initiation signal is generally developed by a single transistor that monitors the power supply voltage $V_D$ in order to maintain the initialization signal only until the monitor transistor becomes conductive upon a supply voltage rising to a level above the transistor threshold voltage. The difficulty with this is that some circuits, such as the latch of FIG. 1, may have critical transistors with higher threshold voltage levels than that of the monitor transistor. The result is that the initialization signal is terminated before each of these threshold levels is exceeded. The result can be that a latch or other bistable circuit will go the opposite state, after the initialization signal is removed, than is desired for the device.

Accordingly, the present invention provides a new and improved technique of monitoring the rise of the supply voltage $V_D$ in order to maintain the initialization signal for sufficient time to assure that the threshold voltage level of all critical transistors in the bistable elements have been exceeded by the supply voltage. The invention is embodied in a circuit of FIG. 2 wherein a voltage divider is formed of transistors 37, 39 and 41 connected in series between the supply voltage $V_D$ and ground potential. Of course, passive resistive elements could be used instead of the transistors. A terminal 43 thus will, in any instant, be at a voltage V1 that is a fraction of the supply voltage $V_D$. A terminal 45 carries a voltage V2 at yet a smaller fraction of the supply voltage $V_D$. These are all the voltages shown on FIG. 3A, voltage V1 taken at the terminal 43 and voltage V2 taken at the terminal 45 of FIG. 2.

Two inverter circuits 47 and 49 have a similar structure but are connected to a different one of the voltage divider terminals 43 and 45. The inverter 47 contains two transistors 51 and 53 connected in series between the power supply voltage $V_D$ and ground potential. An output voltage V4 in a conductor 55 is derived from the junction between the two transistors. The input to the inverter 47 is to the gate of transistor 53 which is connected to the voltage divider terminal 43. The voltage V4 is shown in FIG. 3B for a rising voltage $V_D$ as assumed and shown in FIG. 3A.

The inverter 49 similarly has two transistors 57 and 59 connected in series between the supply voltage $V_D$ and ground potential, an output conductor 61 carrying an output voltage V5, which is shown in FIG. 3C, for the supply voltage rise assumed in FIG. 3A. A gate of the transistor 59 receives an input to the inverter 49 by being connected to the voltage divider terminal 45.

Before explaining the operation of any of the circuit of FIG. 2, its remaining components will be briefly described. Conductors 55 and 61 (voltages V4 and V5, respectively) are the two inputs of a NOR gate 63 having an output in a conductor 65 that is the voltage V6 shown in FIG. 3D. The conductor 65 serves as one input to another NOR gate 67 whose output in a conductor 69 is the voltage V7 shown in FIG. 3E. A third NOR gate 71 forms a latch with the NOR gate 67. An output of the NOR gate 71 in a conductor 73 is a voltage V8 shown in FIG. 3F. The conductor 73 is the second input to the NOR gate 67. The NOR gate 71 has as its two inputs a conductor 75 which is connected to the output conductor 69 of NOR gate 67, and a conductor 77 that is connected to the output conductor 55 of the inverter circuit 47.

The operation of the circuit of FIG. 2 can best be understood with reference to the voltage waveforms of FIGS. 3A through 3F. The quantity on the horizontal axis of each of these curves is the rising power supply voltage $V_D$. This may also be used as a time scale since the power supply voltage $V_D$ is increasing as a function of time immediately after the power supply is connected to the circuit of FIG. 2. This is simultaneous with the connection of the power supply voltage to the remainder of an integrating circuit, such as one including a number of latches of the type previously described with respect to FIG. 1.

It is assumed for purposes of illustration that a threshold voltage level 81 exists with the transistors of the voltage supply monitoring inverters 47 and 49, as well as with the bistable elements of an integrated circuit to which the initialization signal V7 in a line 69 is connected. At voltage or time "a", the power supply voltage $V_D$ has reached the threshold level 81. Ideally, all of the transistor elements should be switched to their initial state at this point but, of course, they do not all have exactly the same threshold level. The inverting circuits 47 and 49, as shown by their output voltage is in FIGS. 3B and 3C, continue to rise. The voltage outputs V4 and V5 are rising with voltage $V_D$ until their respective voltage inputs to the gates of the inverters 47 and 49 exceeds the threshold level 81. With reference to FIGS. 3A and 3B, the voltage V4 will drop at voltage or time "b", the place where the increasing voltage V1 crosses the threshold level 81. Similarly, the inverter 49, since being gated by the voltage V2, has an output voltage V5 (FIG. 3C) that continues to increase as the power supply voltage $V_D$ increases until a voltage or time "c" where the gating voltage V2 crosses the threshold voltage level 81.

In developing the voltages V4 and V5, a time delay has been introduced by gating their respective monitoring circuits 47 and 49 by voltages V1 and V2, respectively, which are always a fraction of the power supply voltage $V_D$ because of the voltage divider that is utilized. Either of the voltages V4 or V5 could serve as the initialization signal that is applied to the bistable elements of the integrated circuit, such as at line 35 of the latch illustrated in FIG. 1. The transistors of the bistable element should be taking on their initial state at time "a", so the termination of the initiation signal at time "b", if voltage V4 is chosen, or time "c" if voltage V5 is chosen, assures the desired initial state. In either case, it will be noted that the initiation signal will be extended in time beyond when the threshold voltage of most elements is reached, regardless of how fast or slow the voltage $V_D$ rises.

In a preferred form of the invention, however, both of the voltages V4 and V5 are used in subsequent logic circuits previously described to produce an initialization voltage V7 (FIG. 3E) that is similar in characteristics to the voltage V5 of FIG. 3C but which includes a hysteresis. That is, if the power supply voltage $V_D$ should drop below the level "c", the initialization signal will not reappear but rather the voltage V7 will remain low until the supply voltage reaches level "b", as indicated in dotted outline in FIG. 3E. At that point, the initialization signal will come on because the transistors of the bistable element in an integrated circuit will have their voltage supply being close to falling below the threshold level "a". The initialization signal then comes on while not prematurely disturbing the circuit operation by coming on between voltages "b" and "c" where the circuit transistors are operating with the power supply voltage safely in excess of their threshold level.

Although the various aspects of the invention have been described with respect to a specific example thereof, it will be understood that the invention is entitled to protection within the full scope of the appended claims.

It is claimed:

1. For use with an integrated circuit having at least one bistable circuit characterized by assuming one of two stable states upon a voltage supply thereto rising from zero, through a threshold switching level of semiconductor elements in said circuit and upward to a maximum voltage supply level, an initiation circuit, comprising:

means associated with said bistable circuit for forcing said circuit to a pre-selected one of its two states in response to an initiation signal, means connected to said voltage supply for providing a control voltage that rises concurrently with said supply voltage but at a reduced rate to a maximum control voltage that is a fraction of said supply voltage, a control semiconductor element having substantially the same threshold switching level as those which are part of said bistable circuit and connected to the control voltage in a manner to switch states when the control voltage reaches its threshold switching level, and means responsive to the state of said control semiconductor element for maintaining said initiation signal until said control semiconductor element switches states upon the control voltage rising above said threshold switching level, whereby said initiation signal is maintained beyond the time that the semiconductor elements of said bistable circuit have assumed their initial states.

2. The initiation circuit according to claim 1 wherein said maintaining means additionally comprises means for keeping said initiation signal turned off as said supply voltage drops below its said pre-determined value, thereby to prevent forcing said plurality of bistable circuit elements to their pre-selected initial states upon a momentary drop in voltage supply that does not otherwise prevent them from properly operating.

3. In an integrated circuit having a plurality of bistable circuits that are each characterized by assuming one of two stable states upon a voltage supply rising from zero through a threshold switching level of semiconductor elements in said circuits and upward towards a maximum voltage supply level, a method of bringing the supply voltage from zero to its full voltage comprising the steps of:

developing from said supply voltage, as it rises from zero to its full voltage, a control voltage that is maintained at a fraction of said supply voltage, applying said control voltage to at least one control semiconductor element having the same threshold switching level as the circuits' semiconductor elements, providing an initialization signal on each of said plurality of bistable circuits in a manner to force each of said bistable circuits to take on a desired initial state, and maintaining said initialization signal until the control voltage exceeds the threshold switching level of said central semiconductor element, at which time the initialization signal is removed, thereby to assure that the supply voltage has exceeded the threshold voltage of the bistable circuits' semiconductor elements before the initialization signal is removed.

4. The method according to claim 3 which comprises the additional step of maintaining said initialization signal removed from said bistable circuits as the supply voltage drops from its full voltage to something less than said semiconductor element threshold switching level, thereby to prevent forcing said bistable circuits to their pre-selected initial states upon a momentary drop in supply voltage that does not otherwise prevent the circuits from properly operating.

5. For use with an integrated circuit having a plurality of memory cells that are each made up of two inverter circuits connected in a manner to give the memory cell two stable states, and further characterized by assuming one of those states upon a voltage supply thereto rising from zero, through a threshold switching level of the inverter circuit and upwards to a maximum voltage supply level, an initiation circuit, comprising:

means associated with said memory cells for forcing each to a preselected one of its two states in response to an initiation signal, means connected to said voltage supply for providing a control voltage that rises concurrently with said supply voltage but at a reduced rate to a maximum control voltage that is a fraction of said supply voltage, a control inverter circuit having substantially the same threshold switching characteristics as those which are part of said memory cells, said control inverter being connected to the control voltage in a manner to switch states, and means responsive to the state of said control inverter circuit for maintaining said initiation signal until said control voltage has risen above said threshold switching level, whereby said initiation signal is maintained beyond the time that the semiconductor elements of said bistable circuit have assumed their initial states.

6. The initiation circuit according to claim 5 wherein said maintaining means additionally comprises means for keeping said initiation signal turned off as said supply voltage drops below said threshold switching voltage level of the inverter circuits, thereby to prevent forcing said memory cells to their preselected initial states upon a momentary drop in voltage supply that does not otherwise prevent them from properly operating.

* * * * *